US008611624B2

(12) United States Patent
Poonawalla et al.

(10) Patent No.: US 8,611,624 B2
(45) Date of Patent: Dec. 17, 2013

(54) METHOD FOR ADIPOSE TISSUE QUANTIFICATION WITH MAGNETIC RESONANCE IMAGING

(75) Inventors: Aziz Hatim Poonawalla, Verona, WI (US); Scott Reeder, Middleton, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 107 days.

(21) Appl. No.: 13/423,800

(22) Filed: Mar. 19, 2012

(65) Prior Publication Data

US 2013/0243290 A1 Sep. 19, 2013

(51) Int. Cl.
*G06K 9/00* (2006.01)

(52) U.S. Cl.
USPC .............................. 382/128; 128/922; 378/4

(58) Field of Classification Search
USPC ................. 382/100, 128, 129, 130, 131, 132; 128/922; 378/4–27
See application file for complete search history.

(56) References Cited

U.S. PATENT DOCUMENTS

| | | | |
|---|---|---|---|
| 6,278,761 B1 * | 8/2001 | Kim et al. | 378/8 |
| 6,307,368 B1 * | 10/2001 | Vasanawala et al. | 324/309 |
| 6,999,549 B2 * | 2/2006 | Sabol et al. | 378/5 |
| 7,916,909 B2 * | 3/2011 | Khazen et al. | 382/128 |
| 7,924,003 B2 | 4/2011 | Yu et al. | |
| 8,427,147 B2 * | 4/2013 | Block et al. | 324/307 |
| 2010/0260397 A1 * | 10/2010 | Block et al. | 382/131 |
| 2010/0268060 A1 * | 10/2010 | Masumoto | 600/407 |
| 2010/0278405 A1 * | 11/2010 | Kakadiaris et al. | 382/131 |
| 2011/0044524 A1 * | 2/2011 | Wang et al. | 382/131 |

OTHER PUBLICATIONS

Alabousi, et al., Validation of Fat Volume Quantification with Ideal MRI, Proc. Intl. Soc. Mag. Reson. Med., 2009, 17:2880.
Conway, et al., Intraabdominal Adipose Tissue and Anthropometric Surrogates in African American Women with Upper- and Lower-Body Obesity, Am. J. Clin. Nutr., 1997, 66:1345-1351.
Hernando, et al., Addressing Phase Errors in Fat-Water Imaging Using a Mixed Magnitude/Complex Fitting Method, Proc. Intl. Soc. Mag. Reson. Med., 2011, 19:753.
Joy, et al., Predicting Abdominal Adipose Tissue Among Women with Familial Partial Lipodystrophy, Metabolism Clinical and Experimental, 2009, 58:828-834.
Kullberg, et al., Automated and Reproducible Segmentation of Visceral and Subcutaneous Adipose Tissue from Abdominal MRI, International Journal of Obesity, 2007, 31:1806-1817.
Kullberg, et al., Automated Assessment of Whole-Body Adipose Tissue Depots from Continuously Moving Bed MRI: A Feasibility Study, Journal of Magnetic Resonance Imaging, 2009, 30:185-193.
Liew, et al., An Adaptive Spatial Fuzzy Clustering Algorithm for 3-D MR Image Segmentation, IEEE Transactions on Medical Imaging, 2003, 22(9):1063-1075.

(Continued)

*Primary Examiner* — Anand Bhatnagar
(74) *Attorney, Agent, or Firm* — Quarles & Brady, LLP

(57) ABSTRACT

A system and method for calculating a quantitative metric of adipose tissue using a magnetic resonance imaging (MRI) system are provided. The MRI system is used to acquire k-space data by sampling echo signals that are formed at a plurality of different echo times. From the acquired k-space data, a fat-concentration map, such as a fat-fraction map is produced. A maximum fat-concentration value is estimated from the fat-concentration map, and is used to threshold the fat-concentration map to produce an adipose mask. From the adipose mask, a quantitative metric of adipose tissue can be calculated.

23 Claims, 3 Drawing Sheets

(56) References Cited

OTHER PUBLICATIONS

Liu, et al., Fat Quantification with Ideal Gradient Echo Imaging: Correction of Bias from T1 and Noise, Magnetic Resonance in Medicine, 2007, 58:354-364.

Machann, et al., Standardized Assessment of Whole Body Adipose Tissue Topography by MRI, Journal of Magnetic Resonance Imaging, 2005, 21:455-462.

Machann, et al., Follow-up Whole-Body Assessment of Adipose Tissue Compartments During a Lifestyle Intervention in a Large Cohort at Increased Risk for Type 2 Diabetes, Radiology, 2010, 257(2):353-363.

Micklesfield, et al., Dual-Energy X-ray Absorptiometry and Anthropometric Estimates of Visceral Fat in Black and White South African Women, Obesity, 2010, 18:619-624.

Onat, et al., Measures of Abdominal Obesity Assessed for Visceral Adiposity and Relation to Coronary Risk, International Journal of Obesity, 2004, 28:1018-1025.

Pouliot, et al., Waist Circumference and Abdominal Sagittal Diameter: Best Simple Anthropometric Indexes of Abdominal Visceral Adipose Tissue Accumulation and Related Cardiovascular Risk in Men and Women, American Journal of Cardiology, 1994, 73(7):460-468.

Yu, et al., Multiecho Reconstruction for Simultaneous Water-Fat Decomposition and T2* Estimation, Journal of Magnetic Resonance Imaging, 2007, 26:1153-1161.

Yu, et al., Magnitude Fitting Following Phase Sensitive Water-Fat Separation to Remove Effects of Phase Errors, Proc. Intl. Soc. Mag. Reson. Med. 2009, 17:462.

Yu, et al., Combination of Complex-Based and Magnitude-Based Multiecho Water-Fat Separation for Accurate Quantification of Fat-Fraction, Magnetic Resonance in Medicine, 2011, 66(1):199-206.

\* cited by examiner

METHOD FOR ADIPOSE TISSUE QUANTIFICATION WITH MAGNETIC RESONANCE IMAGING

STATEMENT REGARDING FEDERALLY SPONSORED RESEARCH

This invention was made with government support under DK083380 and DK088925 awarded by the National Institutes of Health. The government has certain rights in the invention.

BACKGROUND OF THE INVENTION

The field of the invention is systems and methods for magnetic resonance imaging ("MRI"). More particularly, the invention relates to systems and methods for producing quantitative measurements related to adipose tissue using MRI.

Metabolic syndrome is a "clustering" of metabolic abnormalities and cardiovascular risk factors, including obesity, type II diabetes, fatty liver disease and coronary artery disease. People suffering from metabolic syndrome are three times more likely to have a heart attack or stroke, have five-fold greater risk of type II diabetes, and have increased rates of cardiovascular disease and premature death. While the underlying causes of metabolic syndrome are not fully understood, central obesity indicated by excessive visceral adipose tissue ("VAT") inside the abdomen, is known to be a dominant risk factor. In other words, both the amount and the distribution of abdominal fat determine the risk for metabolic syndrome; therefore, any biomarker for central obesity should provide information about both the amount and distribution of abdominal fat to be effective. Ideally, measurement of central obesity should have a direct physiological basis for maximal clinical relevance, requiring a quantitative technique that is independent of platform and protocol.

Unfortunately, no clinical consensus currently exists on diagnostic criteria for central obesity, which severely hinders prospective diagnosis, treatment monitoring, and epidemiological studies of the disease. Anthropometric biomarkers for central obesity such as waist circumference, waist-hip ratio, and body mass index ("BMI") are widely used in the clinical setting; however, these anthropometric measures are not direct physiological measurements of central obesity, but rather indirect surrogates that fail to accurately measure VAT volume. Anthropometric measures are also highly prone to systematic error due to methodological variability in anatomic site, respiratory phase, and even meal timings.

Direct measurement of VAT volume using diagnostic imaging techniques is preferable to anthropometric surrogates, and satisfies the requirement of a physiological basis. For example, x-ray computed tomography ("CT") can provide full abdominal and pelvic coverage with acquisition times of only a few seconds. Unfortunately, CT exposes the patient to medically unnecessary doses of ionizing radiation, limiting its clinical use to diagnosing acute patient illnesses. A safe alternative is $T_1$-weighted magnetic resonance imaging ("MRI"), which delivers no ionizing radiation dose. However, both CT and $T_1$-weighted MRI require hours of prohibitively tedious manual segmentation of VAT from subcutaneous adipose tissue and non-adipose tissues, a process that is cost-inefficient and highly prone to systematic error. Alternatively, histogram-based semi-automatic thresholding of $T_1$-weighted images can be used to identify adipose tissue, but such methods are purely qualitative due to partial volume effects and signal inhomogeneities and, thus, do not provide quantitative measures of VAT.

Adipose tissue segmentation is considerably more efficient and accurate if the fat signal can be isolated during image acquisition. Among techniques for direct imaging of fat, chemical-shift-based MRI has been shown to have superior fat-water separation quality. These techniques exploit the resonance frequency difference between fat and water to provide separate, co-registered images of water, fat and "fat-fraction." In principle, these chemical-shift fat-water imaging methods have great potential for automated adipose tissue segmentation because adipose tissue may be rapidly separated from non-adipose tissue using only a simple fat-fraction threshold, which is typically fifty percent. The time efficiency of using fat-fraction values to segment adipose tissue is a major advantage of chemical-shift methods over manual segmentation; however, prior to thresholding, fat-fraction maps require empirical masking to remove noise in background areas, air cavities, and signal voids, which partly negates the speed advantage of these techniques.

Complete anatomical coverage of the abdomen and pelvis is also necessary to characterize the entire VAT volume. Even using fast three-dimensional gradient-echo sequences and parallel imaging, this is a challenging data acquisition constraint, requiring either multiple breath-hold acquisitions or coarse spatial resolution. Acquiring low-resolution data permits whole-body adipose tissue characterization, but the accuracy of adipose tissue volume measurement is undermined by partial-volume effects. Multiple breath-hold acquisitions allow for higher resolution data, but are more vulnerable to motion artifacts, and may also require corrections for image misregistration between acquisitions.

Furthermore, the accuracy of chemical shift methods is confounded by a number of physical factors including $T_1$ and $T_2^*$ relaxation effects and fat spectral complexity, which if left uncorrected will result in large and significant errors in fat-fraction values. Since most studies define adipose tissue as having fat-fraction values of fifty percent or higher, these errors directly impact the accuracy of VAT or total adipose tissue ("TAT") volume estimation. A chemical-shift fat-water technique that can correct for all confounding factors in fat-fraction measurement is therefore an absolute requirement for truly quantitative adipose tissue measurements.

It would therefore be desirable to provide an accurate, reliable, and generalized system and method for producing quantitative measurements related to adipose tissue.

SUMMARY OF THE INVENTION

The present invention overcomes the aforementioned drawbacks by providing a system and method for using magnetic resonance imaging ("MRI") to produce quantitative metrics of adipose tissue that accurately account for physically meaningful fat-fraction values.

It is an aspect of the invention to provide a system and method for calculating a quantitative metric of adipose tissue using an MRI system. The MRI system is used to acquire k-space data by sampling echo signals that are formed at a plurality of different echo times. From the acquired k-space data, a fat-concentration map is produced. A maximum fat-concentration value is estimated from the fat-concentration, and is used to threshold the fat-concentration map to produce an adipose mask. Generally, the estimated maximum fat-concentration value is a physiologically accurate representation of the fact that voxels containing fat spins will always contain some amount of non-fat related spins. From the adipose mask, a quantitative metric of adipose tissue volume can be calculated. Examples of quantitative metrics of adipose tissue include total adipose tissue ("TAT") volume, visceral adipose tissue ("VAT") volume, and VAT-to-TAT ratio ("VTR"), which is a measure of visceral volume fraction of adipose tissue.

It is another aspect of the invention to provide a non-transitory computer readable storage medium having stored thereon a computer program that includes instructions that when executed by a processor causes the processor to estimate from a stored fat-concentration map, a maximum fat-concentration value that indicates that pixel locations in the fat-concentration map do not contain one-hundred percent fat spins. The processor is also caused to produce an adipose mask using the estimated maximum fat-concentration value and the stored fat-concentration map, and to calculate from the adipose mask a quantitative metric of adipose tissue.

The foregoing and other aspects and advantages of the invention will appear from the following description. In the description, reference is made to the accompanying drawings, which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

A system and method for producing quantitative measurements of adipose tissue that overcome the limitations and drawbacks of the existing methods, such as those discussed above, are provided. The noted limitations and drawbacks are overcome by providing a method that acquires near-isotropic, high-resolution data; produces truly quantitative fat-fraction maps with a full dynamic range of 0-100 percent; automatically and robustly removes noise from the fat-fraction maps without the need for empirical masking; estimates the maximum fat-fraction value from the acquired data; and uses the estimated maximum fat-fraction value to threshold the produced fat-fraction maps. This method is referred to as adipose tissue MRI ("atMRI"), and permits fully automated measurement of the total adipose tissue ("TAT") volume and rapid, semi-automated measurement of visceral adipose tissue ("VAT") volume.

The most common fat-concentration metric is the "proton density fat-fraction" which is the ratio of unconfounded proton signal from triglycerides to the sum of the unconfounded signal from protons from water and triglycerides, and which will be assumed herein, but other types of fat-concentration metrics could also be used including but not limited to the fat-water ratio or a fat-fraction map that may not correct for all confounding factors, such as $T_1$, $T_2^*$, noise bias, eddy currents, spectral complexity of fat, and so on. The fat-concentration map may be produced by any mathematical method that relates the proportion of fat in a voxel to the acquired k-space data and echo times, or by relating the proportion of fat in a voxel to the water image values and fat-image values at that voxel location. It is also noted that imaging modalities other than MRI may be used to calculate quantitative metrics of fat-concentration. For example, x-ray computed tomography ("CT") may also be used to measure fat-concentration metrics.

Figure 1:
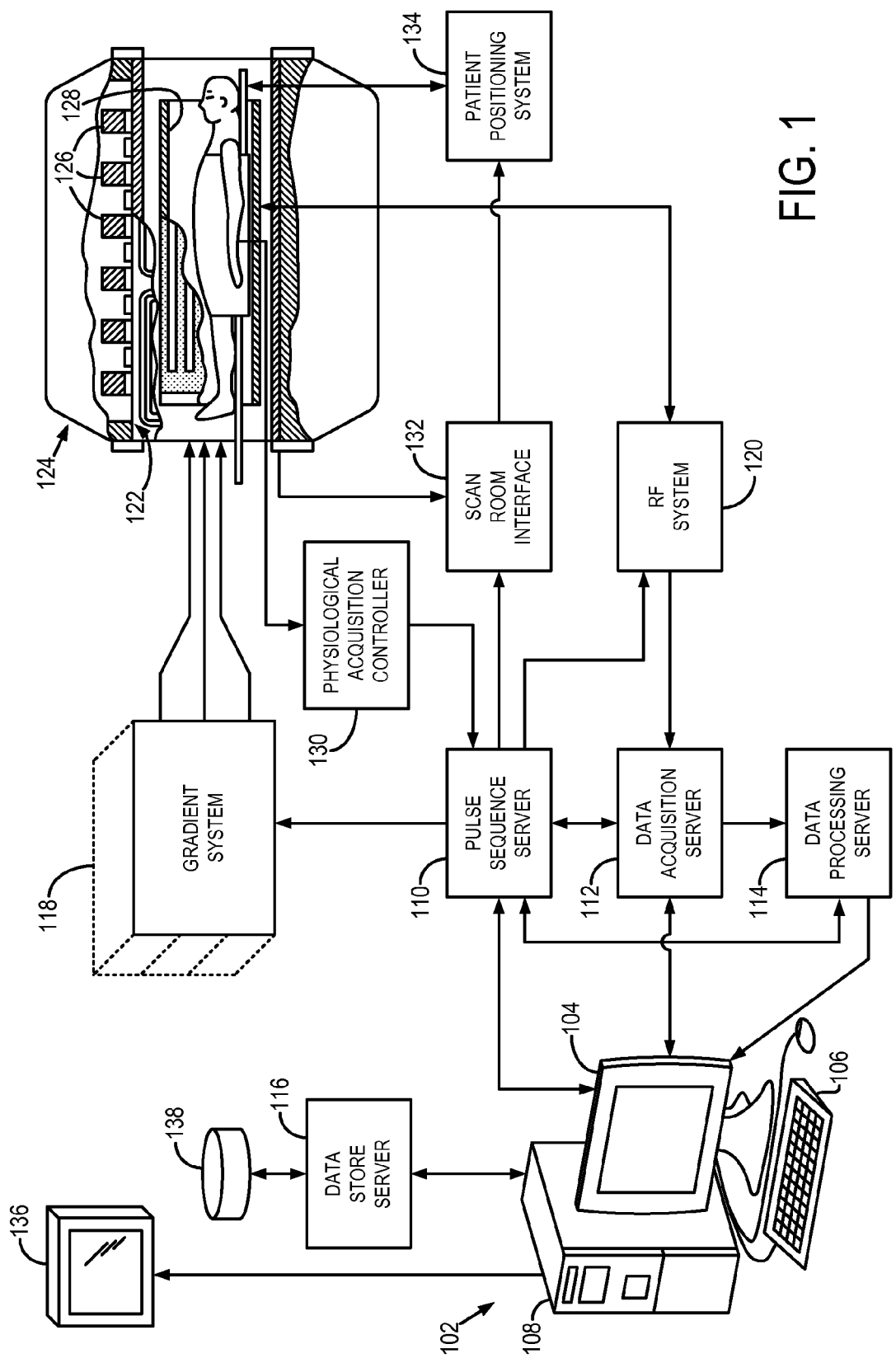
FIG. 1 is a block diagram of an example of a magnetic resonance imaging ("MRI") system.

Referring particularly now to FIG. 1, an example of a magnetic resonance imaging ("MRI") system 100 is illustrated. The MRI system 100 includes a workstation 102 having a display 104 and a keyboard 106. The workstation 102 includes a processor 108, such as a commercially available programmable machine running a commercially available operating system. The workstation 102 provides the operator interface that enables scan prescriptions to be entered into the MRI system 100. The workstation 102 is coupled to four servers: a pulse sequence server 110; a data acquisition server 112; a data processing server 114; and a data store server 116. The workstation 102 and each server 110, 112, 114, and 116 are connected to communicate with each other.

The pulse sequence server 110 functions in response to instructions downloaded from the workstation 102 to operate a gradient system 118 and a radio frequency ("RF") system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding MR signals. The gradient coil assembly 122 forms part of a magnet assembly 124 that includes a polarizing magnet 126 and a whole-body RF coil 128.

RF excitation waveforms are applied to the RF coil 128, or a separate local coil (not shown in FIG. 1), by the RF system 120 to perform the prescribed magnetic resonance pulse sequence. Responsive MR signals detected by the RF coil 128, or a separate local coil (not shown in FIG. 1), are received by the RF system 120, amplified, demodulated, filtered, and digitized under direction of commands produced by the pulse sequence server 110. The RF system 120 includes an RF transmitter for producing a wide variety of RF pulses used in MR pulse sequences. The RF transmitter is responsive to the scan prescription and direction from the pulse sequence server 110 to produce RF pulses of the desired frequency, phase, and pulse amplitude waveform. The generated RF pulses may be applied to the whole body RF coil 128, or to one or more local coils or coil arrays (not shown in FIG. 1).

The RF system 120 also includes one or more RF receiver channels. Each RF receiver channel includes an RF amplifier that amplifies the MR signal received by the coil 128 to which it is connected, and a detector that detects and digitizes the I and Q quadrature components of the received MR signal. The magnitude of the received MR signal may thus be determined at any sampled point by the square root of the sum of the squares of the I and Q components:

$$M = \sqrt{I^2 + Q^2} \tag{1};$$

and the phase of the received MR signal may also be determined:

$$\varphi = \tan^{-1}\left(\frac{Q}{I}\right). \tag{2}$$

The pulse sequence server 110 also optionally receives patient data from a physiological acquisition controller 130. The controller 130 receives signals from a number of different sensors connected to the patient, such as electrocardiograph ("ECG") signals from electrodes, or respiratory signals from a bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized MR signal samples produced by the RF system 120 are received by the data acquisition server 112. The data acquisition server 112 operates in response to instructions downloaded from the workstation 102 to receive the real-time MR data and provide buffer storage, such that no data is lost by data overrun. In some scans, the data acquisition server 112 does little more than pass the acquired MR data to the data processor server 114. However, in scans that require information derived from acquired MR data to control the further performance of the scan, the data acquisition server 112 is programmed to produce such information and convey it to the pulse sequence server 110. For example, during prescans, MR data is acquired and used to calibrate the pulse sequence performed by the pulse sequence server 110.

The data processing server 114 receives MR data from the data acquisition server 112 and processes it in accordance with instructions downloaded from the workstation 102. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 114 are conveyed back to the workstation 102 where they are stored. Real-time images are stored in a data base memory cache (not shown in FIG. 1), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the workstation 102. The workstation 102 may be used by an operator to archive the images, produce films, or send the images via a network to other facilities.

Figure 2:
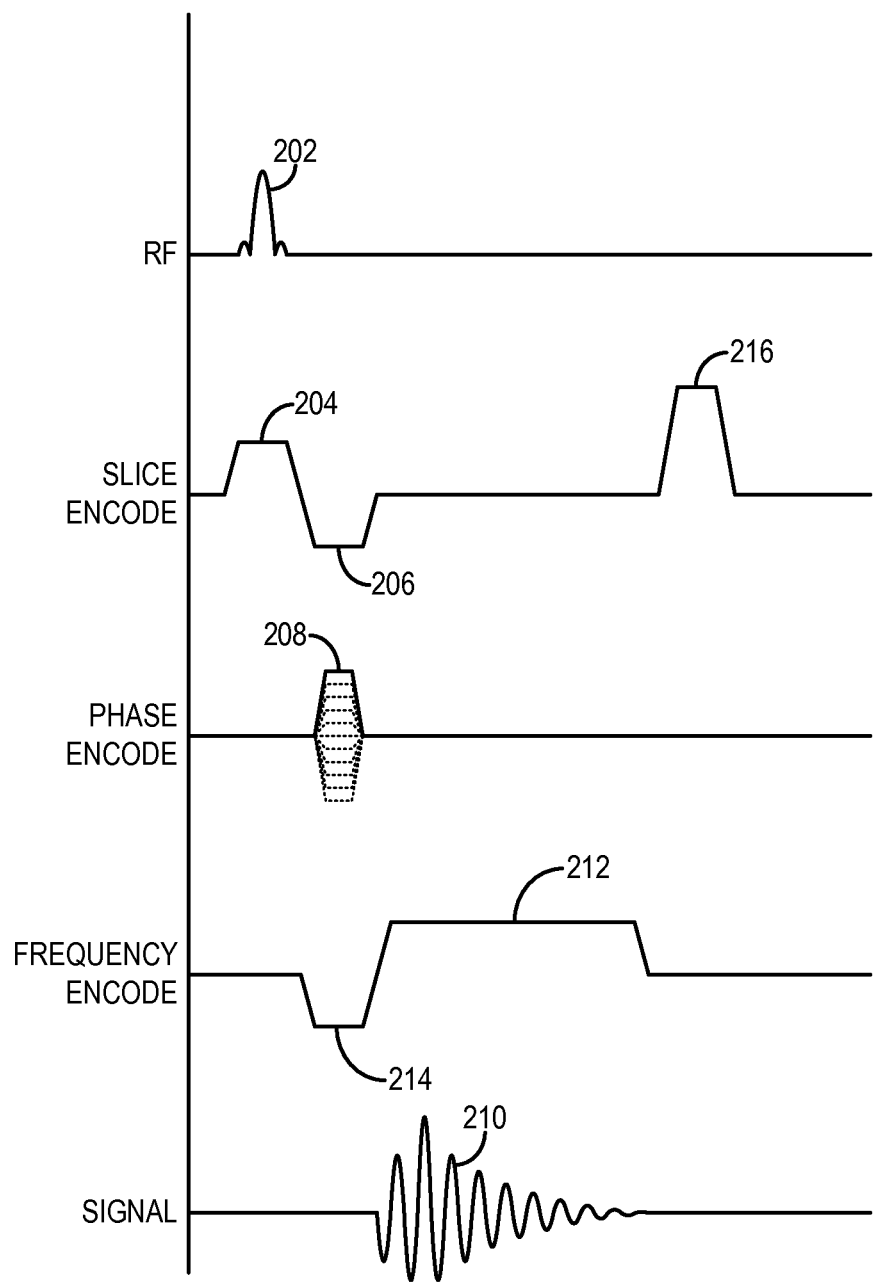
FIG. 2 is a graphic representation of an example of a spoiled gradient recalled echo ("SPGR") pulse sequence for directing the MRI system of FIG. 1 to acquire k-space data.

Referring now to FIG. 2, an example of a pulse sequence that may be employed to direct an MRI system to acquire image data in accordance with embodiments the present invention is illustrated in FIG. 2. Such a pulse sequence is commonly referred to as a spoiled gradient-recalled ("SPGR") echo pulse sequence. It will be appreciated, however, that a variety of different pulse sequences can be employed, including fast spin echo ("FSE") sequences, gradient-recalled echo ("GRE") sequences, steady-state free precession ("SSFP") sequences, echo-planar imaging ("EPI") sequences, spiral imaging sequences, and radial imaging sequences.

The SPGR pulse sequence includes a spatially selective radio frequency ("RF") excitation pulse 202 that is repeated at the start of each repetition time ("TR") period. Moreover, the RF excitation pulse 202 is played out in the presence of a slice-selective gradient 204 in order to produce transverse magnetization in a prescribed imaging slice. The slice-selective gradient 204 includes a rephasing lobe 206 that acts to rephase unwanted phase accruals caused by the RF excitation pulse 202. Following excitation of the nuclear spins in the prescribed imaging slice, a phase encoding gradient 208 is applied to spatially encode a nuclear magnetic resonance signal, representative of a gradient-recalled echo 210, along one direction in the prescribed imaging slice. A readout gradient 212 is also applied after a dephasing gradient lobe 214 to spatially encode the signal representative of echo 210 along a second, orthogonal direction in the prescribed imaging slice. The signal representative of echo 210 is sampled during a data acquisition window.

A rewinder gradient 216 is played out along the phase-select gradient axis in order to rephase remaining transverse magnetization in preparation for subsequent repetitions of the pulse sequence. As is well known in the art, the pulse sequence is repeated and the amplitude of the phase-encoding gradient 206 and the rewinder gradient 216, which is equal in amplitude and area, but opposite in polarity with respect to the phase-encoding gradient 206, are stepped through a set of values such that k-space is sampled in a prescribed manner. The pulse sequence concludes with the application of a spoiler gradient 218 that spoils the remaining transverse magnetization. It will be appreciated by those skilled in the art that the foregoing pulse sequence can be modified into a three-dimensional acquisition, for example, by including a partition-encoding gradient played out along the slice-selection axis following the rephasing lobe 206 of the slice-selective gradient 204.

As will be explained in more detail below, image data is acquired by sampling each prescribed imaging slice a plurality of times at a corresponding plurality of different echo times ("TE"). For example, the TE is incremented during successively subsequent repetitions of the pulse sequence such that N sets of image data corresponding to N different echo times are acquired for each prescribed imaging slice. Alternatively, the N sets of image data can be acquired at N different echo times within the same TR period. Furthermore, the N sets of image data can be acquired at multiple TRs, each collecting a subset of image data. By way of example, the successive echo times are incremented by 1.6-2.0 milliseconds during each successive repetition of the pulse sequence. It is noted that any number of multiple echoes can be acquired when practicing the present invention, including only two echoes, in which so-called "2-point Dixon methods" can be employed. In general, however, as the number of echoes acquired is increased, the spectral differences between species becomes more "observable." Additional echoes may be acquired with low spatial resolution in order to minimize additional scan-time requirements.

Figure 3:
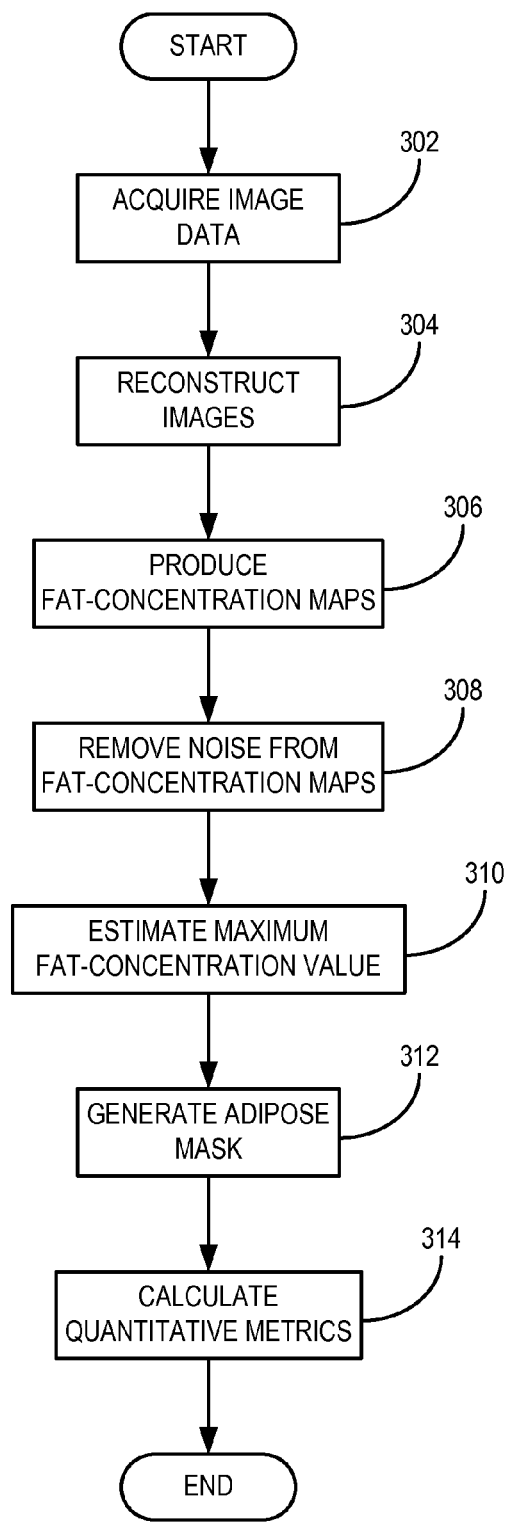
FIG. 3 is a flowchart setting forth the steps of an example of a method for producing quantitative metrics of adipose tissue in accordance with some embodiments of the invention.

Referring now to FIG. 3, a flowchart setting forth the steps of an example of a method for producing an adipose tissue mask with adipose tissue ("atMRI") is illustrated. The method begins with the acquisition of image data, as indicated at step 302. The image data includes k-space data that is acquired by sampling echo signals that are formed at a plurality of different echoes times. For example, k-space may be sampled at six different echo times. By way of example, image data may be acquired with a multichannel radio frequency ("RF") coil array and by employing an accelerated, multi-echo chemical-shift water-fat imaging protocol. For example, a 32-channel phased-array body coil may be used to acquire image data while directing the MRI system to perform a single-slab three-dimensional multi-echo spoiled gradient-echo ("SPGR") pulse sequence. Advantageously, the image data is acquired using a low flip angle excitation, such as three degrees, to minimize $T_1$-weighting bias. It will be appreciated by those skilled in the art, however, that other pulse sequence may be employed and that image data can be acquired as two-dimensional data as opposed to three-dimensional data. Advantageously, image data may be acquired such that images reconstructed from the image data have isotropic or near-isotropic voxels and a high spatial resolution. Data acquisition may also be accelerated by undersampling k-space, for example, by reducing the number of phase-encoding lines that are acquired.

After the desired image data has been acquired, images are reconstructed from the acquired data, as indicated at step 304. By way of example, a multi-peak spectral modeling technique is utilized on the complex-valued image data in order to reconstruct fat and water images. An example of such a multi-peak spectral modeling technique is described in U.S. Pat. No. 7,924,003, which is herein incorporated by reference in its entirety. Image reconstruction may also include employing corrections for $T_2^*$ decay and eddy current-induced phase shifts. An example of the former correction is described, for example, by H. Yu, et al., in "Multiecho Reconstruction for Simultaneous Water-Fat Decomposition and T2* Estimation," *Journal of Magnetic Resonance Imaging*, 2007; 26:1153-1161, which is herein incorporated by reference in its entirety, and an example of the latter correction is described, for example, by H. Yu, et al., in "Magnitude Fitting Following Phase Sensitive Water-Fat Separation to Remove Effects of Phase Errors," *Proceedings of the International Society for Magnetic Resonance in Medicine* 17, 2009; 462, and by H. Yu, et al., in "Combination of Complex-Based and Magnitude-Based Multiecho Water-Fat Separation for Accurate Quantification of Fat-Fraction," *Magnetic Resonance in Medicine*, 2011; 66(1):199-206, which are also herein incorporated by reference in their entirety. Another method that may be used to correct for eddy currents is described by D. Hernando, et al., in "Addressing Phase Errors in Fat-Water Imaging Using a Mixed Magnitude/Complex Fitting Method," *Magnetic Resonance in Medicine*, 2011; 67(3):638-644.

Using the reconstructed images, which include water and fat images, quantitative fat-concentration maps, such as fat-fraction maps, with a full range of values from 0-100 percent are generated, as indicated at step 306. By way of example, a magnitude discrimination technique may be used to minimize noise bias in the generated fat-concentration maps, such as the one described by C. Y. Liu, et al., in "Fat Quantification with IDEAL Gradient Echo Imaging: Correction of Bias from T(1) and Noise," *Magnetic Resonance in Medicine*, 2007; 58:354-364, which is herein incorporated by reference in its entirety.

Next, noise is removed from the generated fat-concentration maps, as indicated at step 308. Generally, noise removal is performed automatically; however, in the alternative some user interaction can also utilized. By way of example, the noise removal process removes random noise contained in the background and air cavities depicted in the fat-concentration maps. Such noise sources generally arise from the definition of the fat-concentration as an image ratio. As an example of a technique that can be used to remove noise from the fat-concentration maps, a k-means least-squares clustering algorithm may be employed. With such a technique, initial seed values for the target clusters are empirically determined and input to the algorithm. Voxels in the fat-concentration maps that contain background noise and air cavities are automatically isolated with the algorithm and used to define a noise mask. This noise mask may then be applied to the fat-concentration maps to effectively and automatically mask out the noisy voxels.

A maximum fat-concentration threshold value is estimated from the fat-concentration maps next, as indicated at step 310. Typically, the maximum fat-concentration value allowed is one-hundred percent, which is incorrect because in vivo adipose tissue typically contains cell organelles, membranes, and other non-lipid components. Thus, the true maximum fat-concentration of adipose tissue will actually be some value, $\eta_{MAX}$, less than one-hundred percent, and a fat-concentration threshold of $\eta_{MAX}/2$ would be more physiologically meaningful. It is an aspect of the present invention that a more physiologically accurate estimate of the maximum fat-concentration value be estimated, as noted above. By way of example, the maximum fat-concentration value, $\eta_{MAX}$, may be estimated by first defining a region-of-interest ("ROI") in a fat-concentration map. The mean fat-concentration value within the ROI is then calculated to obtain an estimate for $\eta_{MAX}$. When the ROI is defined across multiple slices, the mean fat-concentration value may be averaged across those slices to obtain a single value for $\eta_{MAX}$. Automated measurement using histogram analysis is another means for calculating $\eta_{MAX}$ from a single subject. Alternatively, $\eta_{MAX}$ values from multiple subjects may be averaged to obtain a global estimate of $\eta_{MAX}$; however, for such a technique it is preferred that $\eta_{MAX}$ values from only subjects having no pathological findings be used.

The estimated maximum fat-concentration value, $\eta_{MAX}$, is then used to threshold the fat-concentration maps to produce an "adipose mask," as indicated at step 312. By way of example, the adipose mask may be defined as containing all voxels of a fat-concentration map with values greater than or equal to $\eta_{MAX}/2$.

Using the generated adipose mask, metrics indicative of quantitative fat information can be calculated, as indicated at step 314. For example, the volume of TAT may be obtained by counting the number of non-zero voxels in the adipose mask and multiplying by the single-voxel volume. Likewise, the volume of VAT may be obtained by counting the non-zero voxels in the adipose mask that are associated only with visceral adipose tissue and multiplying the result by the single-voxel volume. As an example, calculating the volume of VAT may be performed using a manual segmentation method, in which regions of VAT are selected in each adipose mask by a user. In addition to VAT and TAT, the ratio of VAT to TAT (the "VAT-TAT ratio", or "VTR") may also calculated. This metric serves as a measure of the fraction of abdominal adipose tissue that is VAT.

Any hardware platform suitable for performing the processing described herein is suitable for use with the technology. Non-transitory computer-readable storage media refer to any medium or media that participate in providing instructions to a central processing unit ("CPU"), a processor, a microcontroller, or the like. Such media can take forms including, but not limited to, non-volatile and volatile media such as optical or magnetic disks and dynamic memory, respectively. Examples of non-transitory computer-readable storage media include a floppy disk; a hard disk; magnetic tape; any other magnetic storage medium; a CD-ROM disk; digital video disk ("DVD"); any other optical storage medium; random access memory ("RAM"), including static RAM ("SRAM") and dynamic RAM ("DRMA"); read only memory ("ROM"), including programmable ROM ("PROM"), erasable PROM ("EPROM"), and an electrically erasable PROM ("EEPROM"); and any other memory chip or cartridge.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for calculating a quantitative metric of adipose tissue using a magnetic resonance imaging (MRI) system, the steps of the method comprising:
   a) acquiring k-space data with the MRI system by sampling echo signals that are formed at a plurality of different echo times;
   b) producing a fat-concentration map using the k-space data acquired in step a);
   c) estimating a maximum fat-concentration value from the fat-concentration map produced in step b);
   d) producing an adipose mask using the maximum fat-concentration value estimated in step c) and the fat-concentration map produced in step b); and
   e) calculating a quantitative metric of adipose tissue using the adipose mask produced in step d).

2. The method as recited in claim 1 in which step b) includes:
   i) reconstructing a water image depicting water spins in the subject and a fat image depicting fat spins in the subject by fitting the k-space data acquired in step a) to a signal model that relates the plurality of different echo signals to image intensity values for the water image and the fat image; and
   ii) producing the fat-concentration map using the reconstructed water image and the reconstructed fat image.

3. The method as recited in claim 2 in which the signal model in step b)i) also accounts for a fat spectrum having multiple fat resonance peaks.

4. The method as recited in claim 1 in which step b) includes producing the fat-concentration map by fitting the k-space data acquired in step a) to a signal model that relates the plurality of different echo signals to fat-concentration values.

5. The method as recited in claim 1 in which step c) includes calculating a mean fat-concentration value over a portion of the fat-concentration map produced in step b).

6. The method as recited in claim 1 in which step d) includes thresholding the fat-concentration map produced in step b) using the maximum fat-concentration value estimated in step c).

7. The method as recited in claim 6 in which the adipose mask is produced in step d) by assigning image intensity values from pixel locations in the fat-concentration map produced in step b) to respective pixel locations in the adipose mask when the image intensity values in the fat-concentration map are at least equal to a percentage of the maximum fat-concentration value estimated in step c).

8. The method as recited in claim 7 in which the percentage of the maximum fat-concentration value is fifty percent.

9. The method as recited in claim 1 in which the quantitative metric of adipose tissue calculated in step e) is at least one of a total adipose tissue (TAT) volume, a visceral adipose tissue (VAT) volume, and a VAT-to-TAT ratio (VTR).

10. The method as recited in claim 9 in which the quantitative metric of adipose tissue is TAT volume and is calculated by determining a number of non-zero voxels in the adipose mask and multiplying the number by a volume of a voxel in the fat-concentration map.

11. The method as recited in claim 9 in which the quantitative metric of adipose tissue is VAT volume and is calculated by determining a number of non-zero voxels in the adipose mask that are associated with visceral adipose tissue and multiplying the number by a volume of a voxel in the fat-concentration map.

12. The method as recited in claim 11 in which the number of non-zero voxels in the adipose mask that are associated with visceral adipose tissue are determined using at least one of an automatic segmentation, a semi-automatic segmentation, and a manual segmentation.

13. The method as recited in claim 1 in which step b) includes removing noise from the produced fat-concentration map.

14. The method as recited in claim 13 in which noise is removed from the fat-concentration map produced in step b) by producing a noise mask and applying the produced noise mask to the fat-concentration map.

15. The method as recited in claim 14 in which the noise mask is produced using a clustering algorithm.

16. The method as recited in claim 15 in which the clustering algorithm is a k-means least-squares clustering algorithm.

17. The method as recited in claim 14 in which the noise mask is produced by identifying pixel locations in the fat-concentration map that contain at least one of background noise and air cavities.

18. The method as recited in claim 1 in which step c) includes calculating a fat concentration value automatically using histogram analysis on the fat-concentration map produced in step b).

19. A non-transitory computer readable storage medium having stored thereon a computer program comprising instructions that when executed by a processor causes the processor to:
   i) estimate from a stored fat-concentration map, a maximum fat-concentration value that indicates that pixel locations in the fat-concentration map do not contain one-hundred percent fat spins;
   ii) produce an adipose mask using the estimated maximum fat-concentration value and the stored fat-concentration map; and
   iii) calculate a quantitative metric of adipose tissue using the adipose mask.

20. The non-transitory computer readable storage medium as recited in claim 19 in which in which the processor is further caused to estimate the maximum fat-concentration value by calculating a mean fat-concentration value over a portion of the stored fat-concentration map.

21. The non-transitory computer readable storage medium as recited in claim 19 in which in which the processor is further caused to estimate the maximum fat-concentration value by performing histogram analysis on the stored fat-concentration map.

22. The non-transitory computer readable storage medium as recited in claim 19 in which the quantitative metric of adipose tissue is at least one of a total adipose tissue (TAT) volume, a visceral adipose tissue (VAT) volume, and a VAT-to-TAT ratio (VTR).

23. The non-transitory computer readable storage medium as recited in claim 19 in which the stored fat-concentration map is a fat-concentration generated using at least one of an x-ray computed tomography system and a magnetic resonance imaging system.

* * * * *